United States Patent
Hedberg

(12) 
(10) Patent No.: US 6,307,402 B1
(45) Date of Patent: Oct. 23, 2001

(54) OUTPUT BUFFER FOR DRIVING A SYMMETRICAL TRANSMISSION LINE

(75) Inventor: Mats Hedberg, Haninge (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/628,185

(22) Filed: Jul. 28, 2000

Related U.S. Application Data

(63) Continuation of application No. PCT/EP99/00460, filed on Jan. 25, 1999.

(30) Foreign Application Priority Data

Jan. 30, 1998 (DE) .............................................. 198 03 796

(51) Int. Cl.$^7$ .......................................... H03K 19/0185
(52) U.S. Cl. .............................. 326/86; 326/30; 326/34; 326/115
(58) Field of Search ................................. 326/21, 30, 83, 326/86, 119, 121, 125, 34

(56) References Cited

U.S. PATENT DOCUMENTS

| 4,267,501 | 5/1981 | Smith . |
|---|---|---|
| 5,089,723 | 2/1992 | Davis et al. . |
| 5,266,845 | 11/1993 | Sakaue . |
| 5,296,756 | 3/1994 | Patel et al. . |
| 5,418,478 | 5/1995 | Van Brunt et al. . |
| 5,518,197 | 5/1996 | Gray . |
| 5,519,728 | 5/1996 | Kuo . |
| 5,767,699 | * 6/1998 | Bosnyak et al. ................... 326/86 |
| 5,977,796 | * 11/1999 | Gabara ............................... 326/86 |

FOREIGN PATENT DOCUMENTS 19601386  1/1997 (DE) .

* cited by examiner

Primary Examiner—Michael Tokar
Assistant Examiner—Don Phv Le
(74) Attorney, Agent, or Firm—Burns, Doane, Swecker & Mathis, L.L.P.

(57) ABSTRACT

An output buffer circuit for differentially driving a symmetrical transmission line. The circuit enable power efficient operation at very high bit rates and keeps the common mode voltage on the transmission line within predetermined narrow limits. Circuitry is used to match the impedances of transmission lines and to control the bias of voltage sources at predetermined levels.

9 Claims, 4 Drawing Sheets

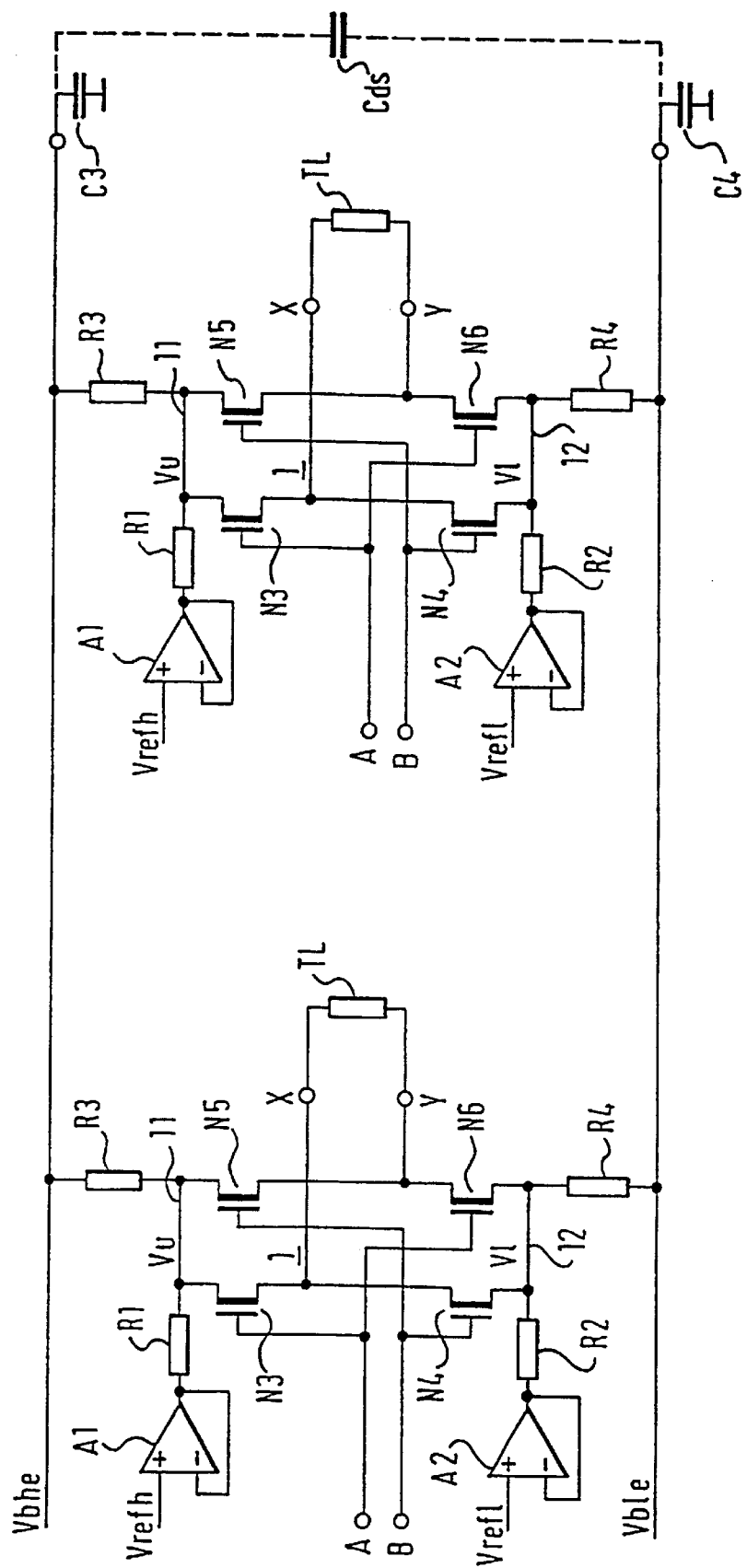

OUTPUT BUFFER FOR DRIVING A SYMMETRICAL TRANSMISSION LINE

This application is a continuation application of International Application No. PCT/EP99/00460, filed Jan. 25, 1999, which designates the United States.

The present invention relates to an output buffer for differentially driving a symmetrical transmission line, according to the preamble of claim 1. An output buffer of this kind is known from U.S. Pat. No. 5,519,728.

Digital communication systems show a continuous increase in complexity and speed. This results in a strong demand for interfaces between different system sections which allow the transmission of digital data with high data rates. Such interfaces should be power efficient in order to keep the total power consumption of complex systems within reasonable limits.

From U.S. Pat. No. 5,519,728 it is known to adopt a differential signaling scheme for transmitting data with high speed and low power over a transmission line. The differential signaling scheme allows to keep the differential signal amplitude across the transmission line low, and hence the power required for transmitting the signals. From this document it is furthermore known to terminate the transmission line at the receiver side in order to improve the signal quality. This document furthermore provides means for keeping the common mode voltage on the symmetrical transmission line at a predetermined level. In this document, this is achieved by means of feeding a constant current into the bridge driving circuit at the transmitter side, and connecting the lower power supply terminal of the bridge driver circuit in series with a resistor connected with ground. The constant current through the bridge and through this resistor results in a constant voltage drop across the resistor which appears as a common mode voltage on the transmission line. The resistor must have a fairly high value if a power efficient design is envisaged.

If reflections occur on the transmission line for whatever reason, e.g. due to changes in the characteristic impedance in the course of the transmission line or improper termination at the receiver side, the output buffer known from this document will not be able to absorb such reflections. Rather, the reflections arriving at the output buffer will be reflected back to the receiver because the constant current source renders a very high output impedance of the output buffer. Such reflections back and forth are particularly disturbing at high bit rates and steep edges of the transmitted signal. This imposes limits on circuits of the kind known from U.S. Pat. No. 5,519,728 when operating at high bit rates.

It is the object of the present invention, to provide an output buffer circuit for differentially driving a symmetrical transmission line, which is able to operate in a power efficient manner at very high bit rates and which is able to keep the common mode voltage on the transmission line within predetermined narrow limits.

According to the present invention, this object is solved as defined in claim 1.

According to the present invention, the output buffer circuit has a power supply circuit for supplying the bridge driver circuit with the power necessary for driving the transmission line, which power supply circuit behaves like a voltage source with a source impedance. The sum of the source impedance of the power supply circuit and of the impedance contributed by the respective diagonal in the ON state of the bridge driver circuit, is selected such that the output impedance of the output buffer circuit essentially matches the characteristic impedance of the transmission line. A voltage generator circuit biases the lower voltage source potential to a predetermined bias level in order to achieve a desired common mode level on the transmission line. Preferably, the voltage generator circuit has an impedance lower than a characteristic impedance, preferably the common mode characteristic impedance of the transmission line.

An output buffer circuit according to the present invention is advantageous in that it allows to match the characteristic impedance of the transmission line at the transmitter side of the transmission line while at the same time, the voltage generator circuit provides for the common mode level expected by the receiver on the transmission line. If the impedance of the generated voltage is sufficiently low, the output buffer circuit can match both the differential and the common mode characteristic impedance of the transmission line. The differential characteristic impedance appears between the two signal conductors of the symmetrical transmission line. The common mode characteristic impedance appears between the respective signal conductor and ground.

Advantageous embodiments are given in the dependent claims.

According to an embodiment of the present invention, the voltage source circuit of the power supply circuit of the output buffer circuit comprises a transistor connected as a source follower. At its control terminal the transistor receives a reference potential. The source of that transistor provides the upper power supply potential to the bridge driver circuit. The lower power supply potential is provided by the voltage generator circuit.

The voltage generator circuit preferably comprises a diode or a series connection of diodes, depending on the desired common mode level, or comprises a transistor connected to provide a constant drain source voltage. This can for instance be achieved by means of connecting gate and drain of that transistor together. If the bias level provided by said voltage generator circuit is the ground level, the voltage generator may simply consist of a resistor.

According to a preferred embodiment, the reference potential applied to the control terminal of the source follower transistor, is generated with reference to the voltage generated by the voltage generator circuit. However, a circuit can be provided for detecting the common mode potential on the transmission line and for controlling the voltage generator circuit such that the common mode level on the transmission approximates a desired level.

Advantageously, the transistors constituting the bridge driver circuit are selected such that the sum of the ON impedances of the transistors constituting a diagonal of the bridge, approximates or equals the differential characteristic line impedance. This structure is simple and requires little space on the surface of an integrated circuit. Preferably, the impedance of the voltage generated by the voltage generator circuit, is selected such that the impedance between at least one of the output terminals and ground of the buffer circuit approximates or equals the common mode characteristic impedance of the transmission line.

According to a preferred embodiment of the present invention, the bridge driver circuit receives its power supply from a supply amplifier the output stage of which is adapted to tolerate output currents not only flowing out of the output stage but also output currents flowing into the output stage. An output stage having this ability is called a push pull stage. The provision of a supply amplifier with this kind of output stage is advantageous in that it allows an even better approximation of the behavior of an ideal voltage source for supplying the bridge driver circuit with power. A resistor can be connected in series between the supply amplifier and the bridge driver circuit in order to adjust the output impedance of the bridge driver circuit.

Preferably, the voltage generator circuit is embodied as an additional supply amplifier with a push pull stage for supplying the lower power supply potential to the bridge driver circuit. In this way it can be achieved that the output buffer circuit behaves highly linear even if reflections arriving at the transmitter result in temporarily feeding power from the transmission line into the power supply circuit of the output buffer.

In the following, advantageous embodiments of the present invention will be described with reference to the accompanying drawings.

FIG. 3 shows an embodiment of decoupling a plurality of output buffer circuits.

Figure 1A:
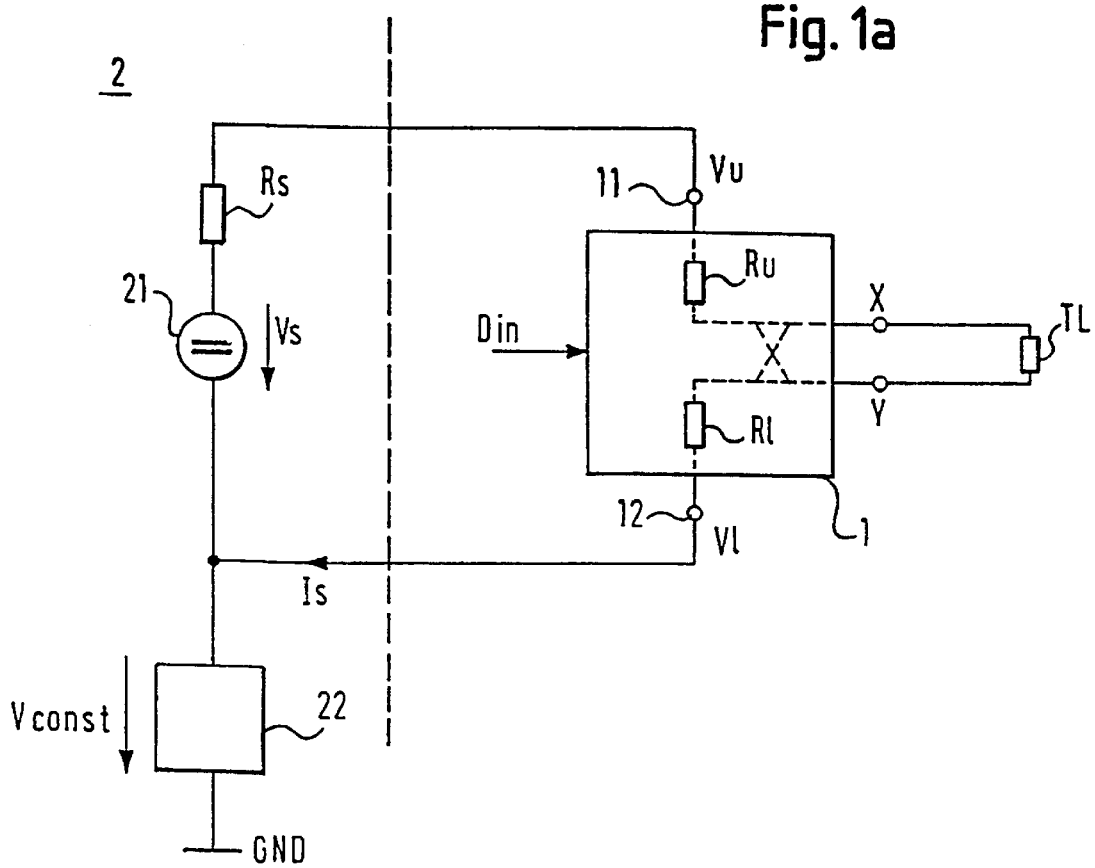
FIG. 1a shows a general block diagram of a first embodiment of the present invention.

FIG. 1a shows a general block diagram of an output buffer circuit according to the present invention. In this block diagram, reference numeral 1 denotes a bridge driver circuit having output terminals X and Y for connection with a transmission line TL. Reference numerals 11 and 12 denote an upper power supply terminal and a lower power supply terminal, respectively, of the bridge driver circuit. The upper and the lower power supply terminal 11 and 12 constitute a power supply input of the bridge driver circuit. Din denotes a signal input for receiving a digital data signal for transmission over the transmission line TL. The bridge driver circuit 1 is adapted to connect each output terminal X, Y with one of the power supply terminals 11, 12 in accordance with the logical state of the input signal to be transmitted, such that a differential signal appears across the output terminals X, Y, in accordance with Din. Ru and Rl represent impedances inherent in the switching elements constituting the bridge driver circuit 1.

Reference numeral 2 denotes a power supply circuit for supplying the bridge driver circuit 1 with power. The power supply circuit 2 comprises a voltage source 21 having a source impedance Rs. Vs denotes the voltage generated by the voltage source 21. The voltage source 21 with the source impedance Rs is connected to supply an upper power supply potential Vu to the upper power supply terminal 11 of the bridge driver circuit, the upper power supply potential Vu being referenced to the lower power supply potential Vl of the lower power supply input 12 of the bridge driver circuit 1.

Reference numeral 22 denotes a voltage generator circuit connected to keep the common mode voltage at the output terminals X, Y at a desired predetermined level. This voltage generator circuit 22 is connected with the voltage source 21 and keeps the lower voltage source potential Vl supplied to the lower power supply terminal 12 of the bridge driver circuit 1, substantially at a predetermined level above ground GND.

The voltage generator circuit 22 is adapted to provide the generated voltage Vconst with a low impedance Rg.

Preferably, the sum of Ru, Rl and Rs is selected to match the differential characteristic impedance of the transmission line TL, i.e. the characteristic impedance of the transmission line between the two signal conductors connected with X and Y, respectively. In this way, differential signal reflections back to the output buffer will be absorbed by the output buffer circuit and will not cause a deterioration of the signal quality at the receiver side.

Rg can be selected such that the output buffer circuit matches the common mode characteristic impedance of the transmission line TL, i.e. the characteristic impedance between the signal conductors of the transmission line TL and ground GND. To this end Rg can be selected lower than the common mode characteristic impedance of the transmission line TL. In this way, common mode reflections back to the output buffer circuit will be absorbed by the output buffer circuit and will not cause a deterioration of the signal quality at the receiver side.

In order to keep the deterioration of the differential signal at the receiver side as small as possible, it is preferable to keep the common mode source impedances for both terminals X and Y of the output buffer circuit as balanced as possible. Accordingly, it is preferable to keep the source impedance Rs of the voltage source 21 small in comparison with Ru und Rl. Preferably, Rs is smaller than 15% of the sum of Ru, Rl and Rs.

Figure 1B:
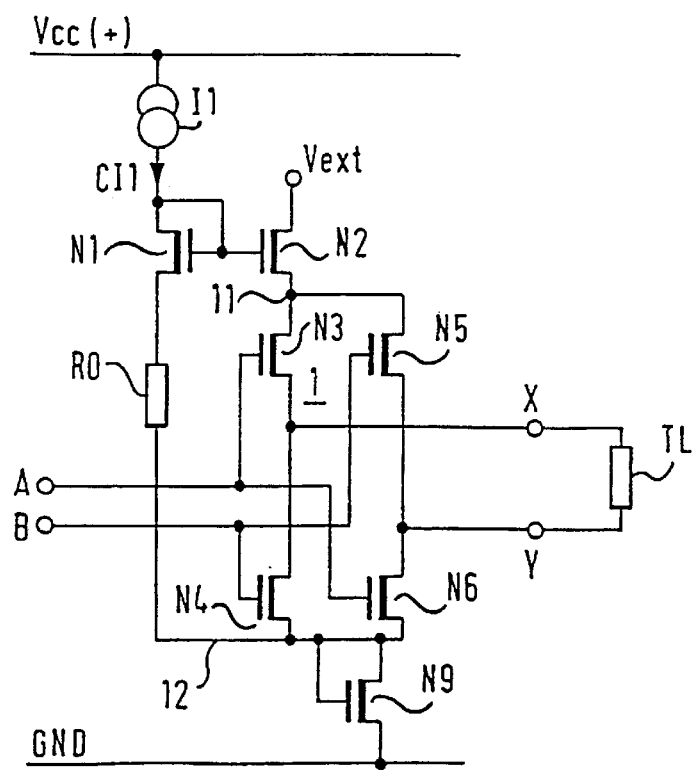
FIG. 1b shows an output buffer circuit according to the first embodiment of the present invention.

FIG. 1b shows an output buffer circuit according to the first embodiment of the present invention.

In this figure, A and B denote input terminals for receiving a digital data signal Din and the inverse of Din, respectively. N3 to N6 denote NMOS transistors connected to constitute a bridge driver circuit. Transistors N3 and N6 form a first diagonal of this bridge driver circuit while transistors N5 and N4 form a second diagonal of this bridge driver circuit. The drains of transistors N3 and N5 are connected together to constitute the upper power supply terminal 11 of the bridge driver circuit. The sources of transistors N4 and N6 are connected together to constitute the lower power supply terminal 12 of the bridge driver circuit. The source of transistor N3 is connected with the drain of transistor N4 and with an output terminal X of the bridge driver circuit. The source of transistor N5 and the drain of transistor N6 are connected together and with an output terminal Y of the bridge driver circuit. The transmission line TL, symbolized in FIG. 1b by its differential characteristic impedance, is connected across the output terminals X and Y. The gates of the transistors N3 and N6 are connected together and with input terminal A. The gates of transistors N5 and N4 are connected together and with input terminal B.

N9 denotes an NMOS transistor having its gate and drain connected together and with the lower power supply terminal 12 of the bridge driver circuit. The source of transistor N9 is connected with ground GND.

N2 denotes a transistor connected as source follower. The source of transistor N2 is connected with the upper power supply terminal 11 of the bridge driver circuit 1. The drain of transistor N2 is connected with an external terminal Vext for receiving a supply voltage for the output stage. In the alternative, the drain of transistor N2 can be connected with a positive supply voltage Vcc of the output buffer circuit. The provision of an external terminal Vext is advantageous in that the application of a low supply voltage Vext will reduce the power dissipated in N2. The low supply voltage applied to Vext can be generated in a power efficient manner for a plurality of output buffer circuits for a plurality of signal channels.

I1 denotes a constant current source providing a constant current CI1. One terminal of the constant current source I1 is connected with Vcc. The other terminal of I1 is connected with the drain and the gate of an NMOS transistor N1 and with the gate of the NMOS transistor N2. The source of transistor N1 is connected with one end of a resistor R0. The other end of the resistor R0 is connected with the lower power supply terminal 12 of the bridge driver circuit 1.

In operation, the bridge driver circuit and specifically the gates of transistors N3 to N6 receive complementary data signals at the terminals A, B, which drive one of the diagonals of the bridge driver circuit 1 to be fully on while the other diagonal is fully off. In this way, a differential signal appears across the output terminals X, Y the sign of which is in accordance with the complementary data signal at the input terminals A, B. The transistors in the ON state receive a gate voltage sufficiently high for the transistors in the ON state to behave essentially like ohmic impedances. In other words, the transistors in the ON state are "saturated". The ON impedance of the respective upper transistor corresponds to Ru in FIG. 1a. The ON impedance of the respective lower transistor corresponds to Rl in FIG. 1a.

The current source I1 forces a constant current CI1 through the drain source channel of N1, through the resistor R0 and through the drain source channel of transistor N9. This results in a substantially constant voltage drop amounting to the threshold voltage across the drain source path of transistor N9. The voltage generated by transistor N9 is essentially independent from the current through N9. The transistor N9 of this embodiment constitutes the voltage generator circuit of FIG. 1a. The voltage across the drain source path can be modelled in FIG. 1a as $Vconst=V_o+Rg \cdot I_s$, $I_s$ being the current flowing out of terminal 12. Rg is the differential impedance of the drain source path of N9 at the operating point $V_o$. For Rg low, Vconst may be called constant.

Transistors N1 and N2 act as a voltage mirror. The voltage at the source of transistor Ni is mirrored at the source of transistor N2, i.e. at the upper power supply terminal 11 of the bridge driver circuit 1. The voltage at the source of N1 is the sum of the voltage drop across R0 due to the constant current CI1 and of the voltage drop across transistor N9. In this way, R0 provides a reference potential difference, and the source of transistor Ni receives a reference voltage referenced to the potential at the drain of transistor N9. As a consequence, the voltage across the upper power supply terminal 11 and the lower power supply terminal 12 of the bridge driver circuit 1 is essentially independent from the voltage across transistor N9.

In the circuit of FIG. 1b, Ru and Rl are determined by the ratio of the channel length to channel width of the corresponding transistors N3 to N6. The impedance Rg of the voltage generator circuit in form of transistor N9 is determined by physical parameters like the slope conductance, width and length, of transistor N9. The source impedance of the voltage source 21 in form of transistor N2 connected as a source follower, depends on physical parameters like the slope conductance, width and length of transistor N2.

In the circuit of FIG. 1b, physical parameters of transistor N2 and the channel length to channel width ratios of transistors N3 to N6 are preferably selected such that the sum of the ON impedances Ru and Rl and of the source impedance provided by transistor N2, matches the differential characteristic impedance of the transmission line TL.

Advantageously, the sum of the ON impedance Ru of the currently conducting one of the upper transistors N3, N5 and of the source impedance Rs of N2 is selected to be approximately equal to the sum of the ON impedance Rl of the currently conducting one of the lower transistors N4, N6 and of the differential impedance Rg provided by N9. In this way, the output buffer circuit provides symmetrical impedances at both terminals X and Y such that common mode reflections will not be transformed into a differential signal across the signal conductors of the transmission line TL, and differential reflections will be efficiently damped too.

Figure 2A:
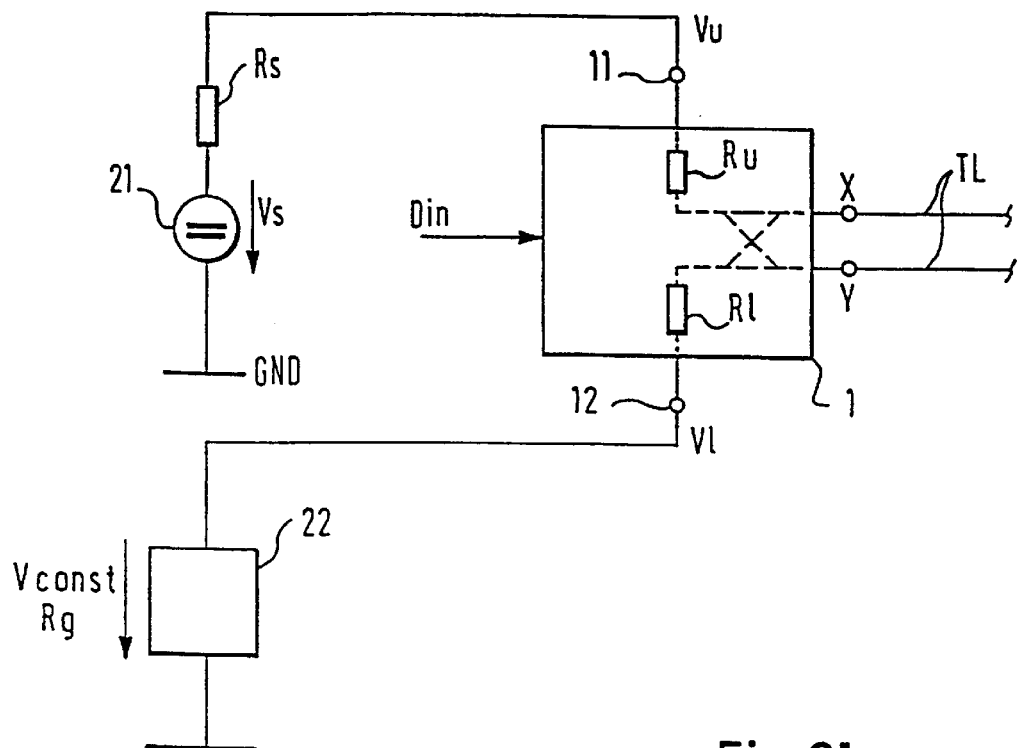
FIG. 2a shows a block diagram of a second embodiment of an output buffer circuit according to the present invention.

FIG. 2a shows a block diagram of a second embodiment of an output buffer circuit according to the present invention.

In FIG. 2a elements identical with or similar to corresponding elements in FIG. 1a have been denoted with the same reference numerals. With regard to these elements, reference is made to the description of FIG. 1a in order to avoid repetitions.

In FIG. 2a, the voltage source circuit 21 is connected with the upper power supply terminal 11 of the bridge driver circuit 1, in order to supply the upper power supply potential Vu of the bridge driver circuit. The other terminal of the power source 21 is connected to ground GND.

The voltage generator circuit 22 is connected with the lower power supply terminal 12 of the bridge driver circuit 1, to supply the lower power supply potential to terminal 12. The other terminal of the voltage generator circuit 22 is connected to ground.

Figure 2B:
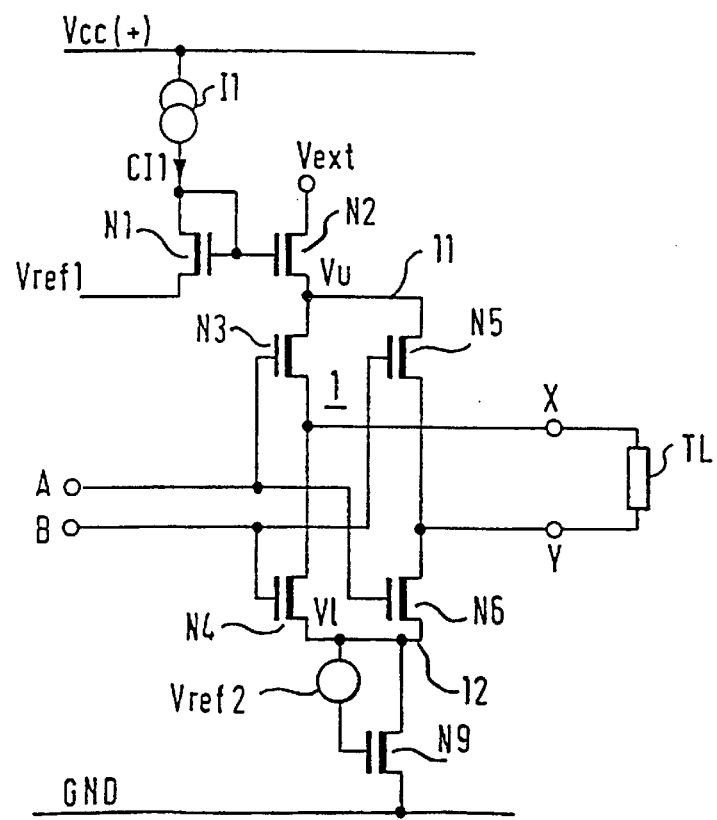
FIG. 2b shows a circuit for implementing the block diagram in FIG. 2a of the second embodiment.

FIG. 2b shows a circuit implementing the block diagram in FIG. 2a of the second embodiment. In this Figure, elements similar to or identical with corresponding elements of FIG. 1b, are denoted with identical reference numerals. With regard to such elements, reference is made to the description given with respect to FIG. 1b in order to avoid repetitions.

In FIG. 2b, Vref2 denotes a circuit for generating a constant voltage between the gate and the drain of transistor N9. This voltage can be generated in many different ways, each of them well known in the art as such. The drain source voltage of transistor N9 will then amount to the sum of Vref2 and the threshold voltage of the NMOS transistor N9. The provision of a voltage source Vref2 in the voltage generator circuit 22 can be advantageous if it is desired to generate a constant voltage Vconst different from the threshold voltage of N9. The constellation of Vref2 and N9 shown in FIG. 2b is an alternative embodiment of the voltage generator circuit of FIG. 1b. Vice versa, in FIG. 2b the voltage source Vref2 can be left out if the threshold voltage provided by transistor N9 is sufficient.

Vref1 denotes a reference voltage with reference to ground GND that is applied to the source of transistor N1. Similar to FIG. 1b, transistors N1 and N2 act as a voltage mirror such that the upper power supply potential Vu at terminal 11 can be regarded as provided by a voltage source 21 with a source potential Vs equal to Vref1 and a source impedance Rs determined by physical parameters of transistor N2.

The differential output impedance at the output terminals X and Y of the output buffer circuit is the sum of the impedances of the transistors in the currently conducting diagonal of the bridge driver circuit, modelled as Ru and Rl in FIG. 2a, and of the impedance provided by the source follower N2, modelled as Rs in FIG. 2a, and furthermore of the impedance Rg of the voltage generator circuit 22. Preferably, this sum is at least approximately equal to the differential characteristic impedance of the transmission line to achieve proper source side termination for differential signals. Preferably, physical parameters of N2 and N9 are selected such that the impedance Rs provided by transistor N2 and the impedance Rg provided by transistor N9 are at least approximately equal, and the physical parameters of transistors N3 to N6 are preferably selected such that the impedances Ru, Rl of these transistors are at least approximately equal. In this way, the common mode output impedance at terminal X will be approximately equal to the common mode output impedance at terminal Y and common mode reflections on the transmission line arriving from the receiver side at the output buffer circuit will not be transformed into a differential signal across the terminals X and Y.

The reference voltage Vrefl applied to the source of transistor N1, can be generated e.g. by means of connecting a reference resistor between the source of transistor N1 and ground GND. In the alternative, a separate constant voltage circuit can be provided for generating Vref1. In this case, the constant current source I1 may be replaced by a simple resistor.

Figure 2C:
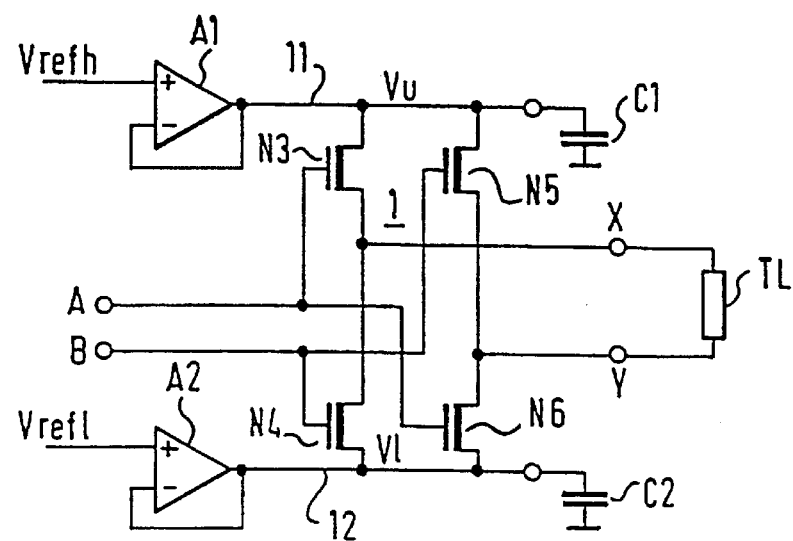
FIG. 2c shows another circuit for implementing the block diagram in FIG. 2a of the second embodiment.

FIG. 2c shows another circuit for implementing the block diagram of an output buffer circuit according to the second embodiment of the present invention. Elements in FIG. 2c which are similar to or identical with corresponding elements in FIG. 1b, are denoted with the same reference numerals. With regard to such elements, reference is made to the description given for FIG. 1b in order to avoid repetitions.

The circuit shown in FIG. 2c comprises an upper supply amplifier A1, the output of which is connected with the upper power supply terminal 11 of the bridge driver circuit 1. The circuit of FIG. 2c furthermore comprises a lower supply amplifier A2 the output of which is connected with the lower power supply terminal 12 of the bridge driver circuit 1. Both amplifiers A1 and A2 respectively have power supply terminals (not shown) which are connected to a power supply bus for providing an upper power supply potential VCC and a lower power supply potential GND. Other ways of supplying the supply amplifiers A1 and A2 with power are equally feasible. The upper supply amplifier A1 in this embodiment comprises an input for receiving an upper reference potential Vrefh. The amplifier A1 provides an amplification factor of preferably 1 such that the output voltage of the amplifier A1 corresponds to the reference potential Vrefh.

Similarly, the lower supply amplifier A2 comprises an input for receiving a lower reference potential Vrefl and has an amplification factor of preferably 1 such that the output voltage of the amplifier A2 corresponds to Vrefl. Of course, other amplification factors are possible. For instance, a resistive feedback network of a type well known as such, is employed. In this case, the output voltage of each amplifier corresponds to the respective reference potential multiplied by the amplification factor.

Each of the supply amplifiers A1, A2 comprises a push pull output stage such that the output voltage of the amplifier will remain substantially constant regardless whether current flows into the output of the amplifier or out of the output of the amplifier. The use of such supply amplifiers A1 and A2 for embodying the voltage source circuit 21 and the voltage generator circuit 22 of FIG. 2a is advantageous in that these 2D supply amplifiers ensure an approximately linear behavior of the output buffer circuit even in situations when power is fed from the output terminals X, Y into the output buffer circuit. This reversal of power flow can e.g. happen if strong reflections occur on the transmission line. Another reason can be that the receiver side feeds or draws a bias current into or out of the output buffer circuit.

As indicated in FIG. 2c, the supply amplifiers A1 and A2 preferably comprise operational amplifiers well known as such. The output of the operational amplifier can be connected with the negative input of the operational amplifier. Given a sufficiently high open loop amplification of the amplifier, the output impedance of each of the amplifiers A1, A2 will be negligibly low in comparison with the ON impedances of the transistors in the currently conducting diagonal of the bridge driver circuit 1. If it is desired to increase the source impedance of the supply amplifiers A1, A2, a series impedance can be connected between the output of the respective amplifier and the corresponding power supply terminal 11 or 12 of the bridge driver circuit 1. The provision of such serial impedance between the output of supply amplifier A1 and power supply terminal 11 of the bridge driver circuit 1 increases Rs in the block diagram of FIG. 2a while the provision of a serial impedance between the output of supply amplifier A2 and the lower power supply terminal 12 of the bridge driver circuit 1 increases the impedance Rg of the voltage generator circuit 22 in the block diagram of FIG. 2a.

The capacitors C1 and C2 denote decoupling capacitors for compensating a decrease of the amplification of the amplifiers A1 and A2 at high frequencies. Capacitor C1 is connected between the output of supply amplifier A1 and ground. Capacitor C2 is connected between the output of supply amplifier A2 and ground. These capacitors can be small because at lower frequencies the supply amplifiers A1 and A2 actively provide a low source impedance.

In the embodiment of FIG. 2c both the voltage source 21 of the block diagram in FIG. 2a and the voltage generator circuit 22 of that block diagram are implemented with supply amplifiers. Of course, it is possible to implement either the voltage source 21 or the voltage generator circuit 22 by means of a supply amplifier and to implement the other one in any of the ways shown in FIGS. 1b or 2b.

FIG. 3 shows an embodiment of connecting a plurality of output buffer circuits of the kind shown in FIG. 2c. In FIG. 3, elements identical with or similar to corresponding elements in FIG. 2c, are denoted with the same reference numerals. With regard to such elements, reference is made to the description given in connection with FIG. 2c in order to avoid repetitions.

In FIG. 3, R1 and R2 denote resistors connected in series with the outputs of the supply amplifiers A1 and A2, respectively, for supplying the upper power supply potential Vu to the upper power supply terminal 11 of the bridge driver circuit 1 and for supplying the lower power supply potential Vl to the lower power supply terminal 12 of the bridge driver circuit 1. R3 denotes a resistor connected between the upper power supply terminal 11 of the bridge driver circuit 1 and an upper decoupling rail Vbhe. R4 denotes a resistor connected between the lower power supply terminal 12 of the bridge driver circuit 1 and a lower decoupling rail Vble. The upper decoupling rail Vbhe is connected with a plurality of resistors R3 corresponding to a plurality of output buffers, as shown in FIG. 3. Similarly, the lower decoupling rail Vble is connected with a plurality of resistors R4 corresponding to the plurality of output buffers. The plurality of output buffer circuits serves a plurality of independent signal channels.

C3 denotes a decoupling capacitor connected between the upper decoupling rail Vbhe and ground. C4 denotes a decoupling capacitor connected between the lower decoupling rail Vble and ground. Cds denotes an optional decoupling capacitor connected across the upper decoupling rail Vbhe and the lower decoupling rail Vble.

The resistors R1 and R2 can have a value much lower than the characteristic impedance of the transmission line connected to the output terminals X and Y or can be replaced by a short circuit. The resistors R3 and R4 constitute a resistive path to the respective decoupling rails Vbhe and Vble which are points of very low impedance for high frequencies due to the provision of the capacitors C3 and C4. For such high frequencies exceeding the cutoff frequency of the supply amplifiers in the respective output buffer circuits, the resistors R3 and R4 determine the source impedance of the buffer together with the ON impedances of the currently conducting diagonal of the bridge driver circuit 1. For low frequencies the respective supply amplifiers provide a low source impedance at the upper power supply terminal 11 and the lower power supply terminal 12 of the respective bridge driver circuits such that cross coupling between different output buffer circuits via the decoupling rails is efficiently suppressed and can be neglected. The circuit shown in FIG. 3 is advantageous in that each of the output buffer circuits shows linear behaviour at the output terminals X and Y even if power is fed back from the transmission line into the output terminals X and Y, without the need of large decoupling capacitors or a large number of decoupling capacitors.

According to a modification not shown in FIG. 3, decoupling elements are connected across nodes 11 and 12 and/or connected across node 11 and ground and across node 12 and ground, of each of the plurality of output buffer circuits. These decoupling elements can be capacitors. Preferably, each decoupling element is a series connection of a resistor and a capacitor or has an electrical characteristic similar to such series connection. The resistive component maintains the matched condition at high frequencies. The decoupling element may be a MOSFET transistor having Source and Drain connected to one of the nodes 11 and 12 of the respective output buffer circuit, and having the gate connected to the other of these nodes 11 and 12. The channel geometry is selected such that the resistivity of the channel acting as one of two capacitor electrodes, provides the resistive component required for maintaining the matched condition at high frequencies.

If this modification is adopted, the decoupling rails Vbhe and Vble may not be necessary or may take the function of alternative external user selectable power supply rails for connection with an external power source. In this case, the resistors R3 and R4 can be replaced by MOSFET transistors having an ON resistance corresponding to R3 and R4, respectively. The amplifiers A1 and A2 are then provided with an enable/disable input for receiving an externally applied selection signal. The gates of the MOSFET transistors replacing R3 and R4 receive a control signal derived from this selection signal such that depending on the state of the selection signal, the supply amplifiers are disabled with the MOSFETs being in the ON state or vice versa.

Figure 4:
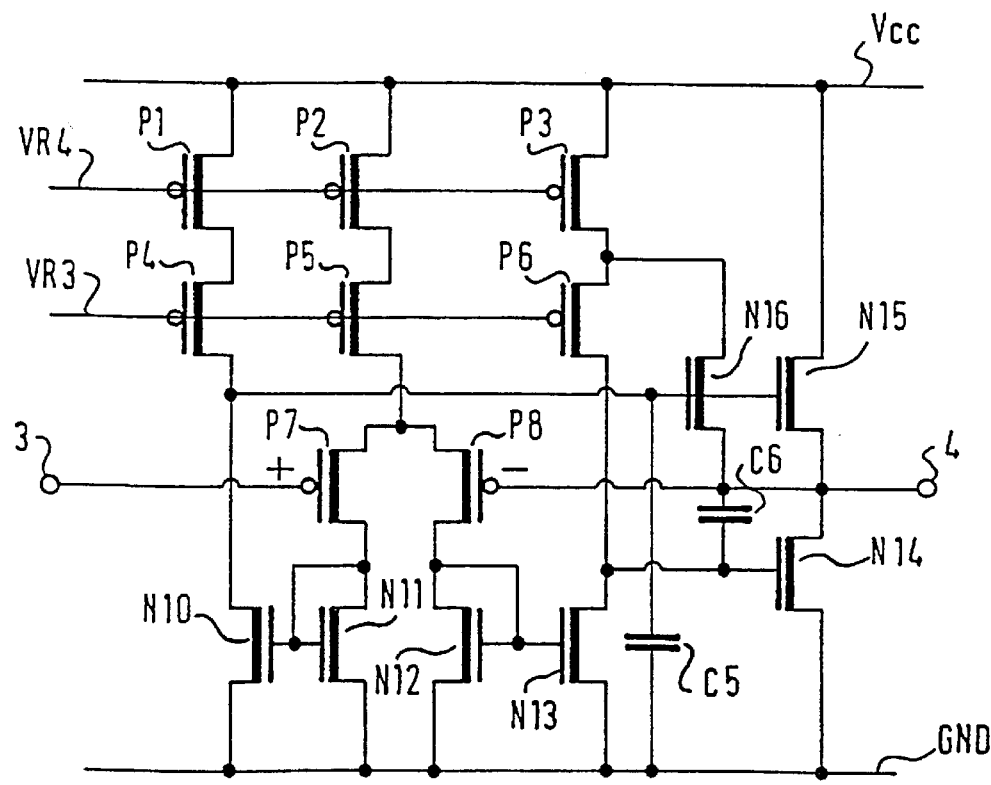
FIG. 4 shows an embodiment of a supply amplifier of the embodiments of FIGS. 2c and 3.

FIG. 4 shows an embodiment of a supply amplifier. In this Figure, reference numeral 3 denotes an input for receiving a reference potential. Reference numeral 4 denotes the output of the supply amplifier. Vcc denotes a power supply line of the supply. amplifier. GND denotes ground potential.

In this embodiment of a supply amplifier, the NMOS transistors N14 and N15 constitute a push pull stage. The term "push pull stage" generally refers to an output stage comprising two active devices connected to cooperate such that the output stage can both output a current and receive current at its output. One of the active devices provides a path between the positive power supply Vcc of the output stage and the output terminal 4 while the other active device provides a path between the output terminal 4 of the push pull stage and ground.

In the embodiment shown in FIG. 4, the drain of transistor 15 is connected with Vcc and the source of that transistor is connected with the output 4 of the supply amplifier. The drain of transistor N14 is connected with the output 4 and the source of transistor N14 is connected with ground.

P7 and P8 denote PMOS transistors having their sources connected together in order to constitute a voltage difference amplifier. The gate of P8 is connected with the output 4 of the supply amplifier. This connection ensures that the supply amplifier of FIG. 4 has unity gain. The gate of transistor P7 is connected with the input terminal 3 of the supply amplifier, for receiving a reference potential which determines the potential at the output 4 of the supply amplifier.

P1 and P4 denote PMOS transistors having their channels connected in series. The source of transistor P1 is connected with Vcc. The drain of transistor P4 is connected with the drain of an NMOS transistor N10. The source of transistor N10 is connected with ground GND. The drain of transistor P4 is furthermore connected with the gate of transistor N15.

P2 and P5 denote PMOS transistors having their channels connected in series. The source of transistor P2 is connected with Vcc. The drain of transistor P5 is connected with the sources of transistors P7 and P8. N11 denotes an NMOS transistor the drain of which is connected with the drain of transistor P7. The source of transistor N11 is connected with ground. The drain of transistor N11 is connected with the gate of transistor N10 and with the gate of transistor N11.

P3 denotes a PMOS transistor the source of which is connected with Vcc. The drain of transistor P3 is connected with the source of a PMOS transistor P6. The drain of transistor P6 is connected with the drain of an NMOS transistor N13. The source of the NMOS transistor N13 is connected to ground GND. The drain of transistor N13 is furthermore connected with the gate of transistor N14.

N12 denotes an NMOS transistor having its drain connected to the drain of transistor P8. The source of transistor N12 is connected with ground GND. The drain of transistor N12 is connected with the gate of transistor N12 and with the gate of transistor N13.

N16 denotes an NMOS transistor having its drain connected with the drain of transistor P3 and the source of transistor P6. The source of transistor N16 is connected with the output 4 of the supply amplifier. The gate of transistor N16 is connected with the drain of transistor P4. C6 denotes a capacitor connected between the output 4 and the gate of transistor N14. C5 denotes a capacitor connected between the drain of transistor P4 and ground.

The circuit shown in FIG. 4 constitutes an operational amplifier having a noninverting input at the gate of transistor P7 and an inverting input at the gate of transistor P8, the inverting input being directly connected with the output 4. The gates of the transistors P1, P2 and P3 receive a reference voltage VR4 referenced to the positive supply voltage Vcc. The gates of the transistors P4, P5 and P6 receive a reference voltage VR3 referenced to the positive supply voltage Vcc. The potential VR3 is kept below the potential VR4. In this way, the transistors P1 and P4 cooperate to constitute a current source of the cascode type. Similarly, P2 and P5 constitute a current source of the cascode type. If the effect of transistor N16 is left aside, also the transistors P3 and P6 act as a current source of the cascode type.

In operation, the transistors P2 and P5 provide a constant current into the voltage difference amplifier constituted by transistors P7 and P8. Transistors N10 and N11 on the one hand and transistors N12 and N13 on the other hand, respectively constitute current mirrors. The current supplied by the transistors P2 and P5 into the voltage difference stage P7, P8 is divided among these two transistors according to the voltage difference across the gates of transistors P7 and P8. This current difference through the transistors P7 and P8 appears as a voltage difference across the drains of transistors N10 and N13 which drive the gates of the push pull stage constituted by the transistors N15, N14. Transistor N16 serves to limit the current flowing from the positive power supply Vcc through transistor N15 and through transistor N14 to ground. If this current through the output stage N14, N15 rises, transistor N16 opens to shunt the current supplied by the current source P3, P6 such that the gate potential of transistor N14 decreases. This in turn results in the gate potential of transistor N15 decreasing such that the current through N15 and N14 is effectively limited.

The embodiment of a supply amplifier shown in FIG. 4 is given by way of example only. It will be appreciated that a large variety of amplifier circuits is suitable as a supply amplifier as long as the output stage of the amplifier is designed such that the output of the amplifier can output current and can also receive current.

What is claimed is:

1. An output buffer circuit for differentially driving a symmetrical transmission line (TL), comprising output transistors (N3 to N6) each having a controllably conductive path, the conductive paths of said output transistors being connected to constitute a bridge driver circuit;

said bridge driver circuit having a signal input (Din) for receiving a data signal to be transmitted over said transmission line (TL), a signal output (X, Y) for connection with said transmission line (TL), and a power supply input;

a power supply circuit for supplying an upper power supply potential (Vu) and a lower power supply potential (V) to said bridge driver circuit;

said power supply circuit being adapted to constitute a voltage source having a lower voltage source potential and an upper voltage source and a source impedance (Rs);

a sum of said source impedance (Rs) and of an ON impedance (Ru, R) of a diagonal of said bridge driver circuit being selected to match the characteristic impedance of said transmission line;

said power supply circuit comprising a voltage generator circuit for biasing the lower voltage source potential at a predetermined level;

characterized in that said power supply circuit comprises a series connection of transistors (N14, N15) connected to constitute a push pull stage;

the output of said push pull stage being connected with said power supply input of said bridge driver circuit.

2. An output buffer circuit according to claim 1, wherein said power supply circuit includes a circuit for detecting an output voltage supplied by said push pull stage, and for controlling said push pull stage such that it outputs a supply voltage substantially independent from a supply current supplied by said push pull stage to said bridge driver circuit.

3. An output buffer circuit according to claim 1, wherein impedance means (Ri, R2) are connected between said output of said push pull stage (A1, A2) and said power supply input of said bridge driver circuit.

4. An output buffer circuit according to claim 1, wherein said means for biasing the lower voltage source potential at a predetermined level comprises a second push pull stage (A2) having its output connected to said lower power supply input of said bridge driver circuit.

5. An output buffer circuit according to claim 4, wherein said power supply circuit includes a circuit for detecting an output voltage supplied by said second push pull stage (A2), and for controlling said second push pull stage such that it outputs a supply voltage substantially independent from a supply current supplied by said second push pull stage (A2) to said bridge driver circuit.

6. An output buffer circuit according to claim 5, wherein a resistance (R2) is connected in series between the output of said second push pull stage and said lower power supply input of said bridge driver circuit.

7. An output buffer circuit according to claim 1, comprising a decoupling circuit (C1, C2) connected to said power supply input of said bridge driver circuit, for compensating the frequency characteristic of the source impedance of said power supply circuit (A1, A2) at high frequencies.

8. An output buffer circuit according to claim 1, wherein control terminals of said output transistors (N3 to N6) of said bridge driver circuit are connected such that transistors of a first diagonal of said bridge driver circuit take one of a low impedance state and a high impedance state while transistors of a second diagonal of said bridge driver circuit take the other of said states, in accordance with said data signal (Din).

9. An output buffer circuit according to claim 1, wherein said means for biasing the lower voltage source potential is adapted to keep said lower voltage source potential at a predetermined level above ground.

* * * * *